(12) United States Patent
Rémigy

(10) Patent No.: US 10,672,587 B2
(45) Date of Patent: Jun. 2, 2020

(54) PREPARATION OF CRYOGENIC SAMPLE, E.G. FOR CHARGED PARTICLE MICROSCOPY

(71) Applicant: FEI Company, Hillsboro, OR (US)

(72) Inventor: Hervé-William Rémigy, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/210,567

(22) Filed: Dec. 5, 2018

(65) Prior Publication Data

US 2019/0180974 A1    Jun. 13, 2019

(30) Foreign Application Priority Data

Dec. 8, 2017 (EP) .................................... 17206186

(51) Int. Cl.
| | | |
|---|---|---|
| *H01J 37/18* | (2006.01) | |
| *G01N 1/42* | (2006.01) | |
| *F25B 19/00* | (2006.01) | |
| *H01J 37/20* | (2006.01) | |
| *H01J 37/22* | (2006.01) | |
| *H01J 37/244* | (2006.01) | |
| *H01J 37/26* | (2006.01) | |

(52) U.S. Cl.
CPC ............ *H01J 37/18* (2013.01); *F25B 19/005* (2013.01); *G01N 1/42* (2013.01); *H01J 37/20* (2013.01); *H01J 37/226* (2013.01); *H01J 37/244* (2013.01); *H01J 37/261* (2013.01); *H01J 2237/2001* (2013.01); *H01J 2237/202* (2013.01)

(58) Field of Classification Search
CPC ........ H01J 37/18; H01J 37/261; H01J 37/244; H01J 37/226; H01J 37/20; H01J 2237/202; H01J 2237/2001; F25B 19/005; G01N 1/42

USPC ................ 250/440.11, 441.11, 442.11, 443.1
See application file for complete search history.

(56) References Cited

U.S. PATENT DOCUMENTS

| | | |
|---|---|---|
| 2015/0090878 A1 | 4/2015 | Remigy |
| 2017/0169991 A1* | 6/2017 | Remigy ................ F25B 19/005 |

OTHER PUBLICATIONS

H. Moor et al, The Influence of High Pressure Freezing on Mammalian Nerve Tissue, Cell and Tissue Research, Jul. 1, 1980, pp. 201-216, vol. 209, No. 2, Springer-Verlag.
Extended European Search Report for Application No. 17206186.3, dated Jun. 1, 2018, 9 pages.

* cited by examiner

*Primary Examiner* — Michael Maskell

(57) ABSTRACT

A method of preparing a cryogenic sample (e.g. for study in a charged-particle microscope), whereby the sample is subjected to rapid cooling using a cryogen, comprising the following steps:

Providing two conduits for transporting cryogenic fluid, each of which conduits opens out into a mouthpiece, which mouthpieces are arranged to face each other across an intervening gap;

Placing the sample in said gap;

Pumping cryogenic fluid through said conduits so as to concurrently flush from said mouthpieces, thereby suddenly immersing the sample in cryogenic fluid from two opposite sides, wherein the flush of cryogenic fluid applied from a first of said mouthpieces is different—e.g. has a different duration—to that applied from the second of said mouthpieces.

13 Claims, 6 Drawing Sheets

PREPARATION OF CRYOGENIC SAMPLE, E.G. FOR CHARGED PARTICLE MICROSCOPY

The invention relates to a method of preparing a cryogenic sample, whereby the sample is subjected to rapid cooling using a cryogen, comprising the following steps:
  Providing two conduits for transporting cryogenic fluid, each of which conduits opens out into a mouthpiece, which mouthpieces are arranged to face each other across an intervening gap;
  Placing the sample in said gap;
  Pumping cryogenic fluid through said conduits so as to concurrently flush from said mouthpieces, thereby suddenly immersing the sample in cryogenic fluid from two opposite sides.

The invention additionally relates to an apparatus for performing such a method.

The invention also relates to the use of such a sample in a charged-particle microscope, comprising:
  A sample holder, for holding the sample;
  A cooling device, for maintaining the sample at a cryogenic temperature at least while it is on said sample holder;
  A source, for producing a beam of charged particles;
  An illuminator, for directing said beam so as to irradiate the sample;
  A detector, for detecting a flux of radiation emanating from the sample in response to said irradiation.

The term "cryogen" should be interpreted as referring to a liquid at cryogenic temperatures, i.e. at or below −150° C. Examples of such cryogens include liquid ethane, liquid propane, liquid oxygen, and mixtures hereof.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
  In a SEM, irradiation of a sample by a scanning electron beam precipitates emanation of "auxiliary" radiation from the sample, in the form of secondary electrons, backscattered electrons, X-rays and photoluminescence (infrared, visible and/or ultraviolet photons), for example; one or more components of this flux of emanating radiation is/are then detected and used for image accumulation purposes.
  In a TEM, the electron beam used to irradiate the sample is chosen to be of a high-enough energy to penetrate the sample (which, to this end, will generally be thinner than in the case of a SEM sample); the flux of transmitted electrons emanating from the sample can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged Particle Microscope (CPM) will comprise at least the following components:
  A radiation source, such as a Schottky electron source or ion gun.
  An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its output beam to perform a scanning motion across the sample being investigated.
  A sample holder, on which a sample under investigation can be held and positioned (e.g. tilted, rotated). If desired, this holder can be moved so as to effect scanning motion of the beam w.r.t. the sample. In general, such a sample holder will be connected to a positioning system such as a mechanical stage. The holder may comprise means to maintain the sample in a given (hot or cold) temperature range; in the specific context of the current invention, it will typically comprise means for maintaining the sample at cryogenic temperatures.
  A detector (for detecting radiation emanating from an irradiated sample), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM, for example), the CPM will also comprise:
  An imaging system, which essentially takes charged particles that are transmitted through a sample (plane) and directs (focuses) them onto analysis apparatus, such as a detection/imaging device, spectroscopic apparatus (such as an EELS module; EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention will—by way of example—often be set forth in the specific context of electron microscopy. However, such simplification is intended solely for clarity/illustrative purposes, and should not be interpreted as limiting.

Biological specimens (such as cells, cell components, single-cellular organisms, etc.) that need to be stored and studied in a body of aqueous liquid (such as water, electrolyte, cell fluid, blood plasma, etc.) can present significant challenges vis-à-vis their examination in a CPM, since:

An aqueous liquid introduced into a (quasi-)vacuum environment of a CPM will start to outgas/boil, thus tending to degrade the specimen;

In order to prevent this, a sample (specimen+aqueous liquid) can first be frozen before being introduced into said vacuum;

However, so as to prevent damage to the specimen caused by the formation of (sharp) ice crystals, such freezing must generally be performed very rapidly, with the aim of achieving sample vitrification (solidification into an amorphous, glass-like phase) without significant ice crystallization.

In order to facilitate such vitrification—but also to allow the sample to be studied in a transmission-type CPM, such as a TEM—the sample should be relatively thin (sheet-like), but one should still be able to support it by its edges (so that the employed means of support have no significant effect on beam penetration). To this end, use if typically made of a grid-like holder (such as a so-called TEM Autogrid®), across which a perforated membrane (such as a so-called "holey carbon film") is spanned, in whose perforations a small quantity of sample can be held (by surface tension effects). See FIG. 1, for example.

A method as set forth in the opening paragraph above is known from U.S. 2017/0169991 A1, which has the same inventor/assignee as the current application, and is incorporated herein by reference. Although the technique set forth in said document produced a significant improvement compared to the prior-art techniques that pre-dated it, the inventor sought to improve it still further. The results of this endeavor are the subject of the current invention.

It is an object of the invention to provide an improved method of preparing cryogenic samples by vitrification. In particular, it is an object of the invention that such a method should produce more consistent results as compared to prior-art techniques. Specifically, it is an object of the invention that the new method should reduce the occurrence of (partially) damaged samples in the vitrification process.

These and other objects are achieved in a method as set forth in the opening paragraph above, which method is characterized as defined in claim 1. According to the method, the flush of cryogenic fluid applied from a first of said mouthpieces is reduced after a given time interval, such that the flush of cryogenic fluid from said first of said mouthpieces is different to that applied from the second of said mouthpieces.

This novel technique differs from the technique in U.S. 2017/0169991 A1 in that it produces deliberate asymmetry/disparity as regards the cooling of the sample's backside (facing one of said mouthpieces) and frontside (facing the other of said mouthpieces). In the current invention, the flush of cryogen from each mouthpiece can be different in terms of, for example, one or more of cryogen type, phase, temperature, flow cross-section, flow rate, flush duration, etc. This intentional difference flows forth from the inventor's research into vitrification of aqueous samples disposed on grid-mounted perforated membranes, whereby he observed that, when using the technique in U.S. 2017/0169991 A1, some cells/squares of membrane were (in certain situations) prone to detach from the grid: see FIG. 2, for example. Looking into this phenomenon more thoroughly, the inventor observed that such cells/squares appeared to be severing/detaching from the rest of the membrane with a particular directionality/non-isometry, i.e. in a direction from backside (the side of the membrane facing toward the grid) to frontside (the side of the membrane facing away from the grid). After considerable research, the inventor came to the conclusion that the presence of the grid on one side (backside) of the membrane but not on the other side (frontside) created intrinsically different conditions that often required the backside and frontside vitrification to be individually tailored/optimized. More specifically, the inventor concluded that, with an identical flush applied to both backside and frontside, there was a chance of the backside being excessively flushed, with an attendant elevated risk of damage/breakage from that side. The inventor thus designed experiments in which the backside received a "less vigorous" flush than the front side, e.g. by changing the flush pressure, modifying the flush distribution (using different mouthpieces), changing the flush duration of backside relative to frontside and/or freeing space on the backside so as to evacuate cryogen therefrom and consequently lower the pressure compared to the frontside. This yielded encouraging results, with a substantial reduction in the occurrence of damaged/detached cells/squares.

One way of explaining the phenomena set forth in the previous paragraph stems from the realization that the presence of the grid on one side (backside) of the membrane produces a different flow behavior (and associated thermal effects) on that side relative to the other side (front side) of the membrane. In essence, the grid "compartmentalizes" the space at the backside of the membrane, impeding lateral flow of cryogen (along the membrane), and tending to cause attendant turbulence effects. In a way, the grid tends to "focus"/concentrate (within the grid cells) the mechanical forces/thermal effects associated with the backside flush—which can locally overwhelm the membrane if mitigating measures are not taken.

For completeness, it should be realized that the cryogenic fluid that is flushed from the mouthpieces may be a liquid or a (dry) gas/vapor, and it may be the same or different for each mouthpiece; in general, liquids tend to be preferable over gas-phase fluids, inter alia because of the greater heat capacity of liquids, and the relative ease with which they can be stored and pumped. It should also be noted that, if desired, the mouthpieces may contain a mesh (sieve) or other form of flow-path sub-division, e.g. so as to achieve laminar flow and/or a particular flow pattern; as alluded to above, this mesh need not be the same for both mouthpieces.

In an embodiment, reducing comprises the step of terminating the flush from said first mouthpiece after said given time interval. Hence, one side is cooled for a longer period, compared to the opposite side.

In a set-up according to the present invention, the cryogenic fluid may, for example, be pumped through the employed conduits using one or more (electric) pumps; these may be switched on/off as required, and/or a valve system can be used to open/close the flow in the conduits at will. Such a set-up allows, for example, the flow rate and/or flow duration in one of the conduits to be different to that in the other conduit, in accordance with (an embodiment of) the present invention. However, in an alternative embodiment, use is made of a "manual pumping" set-up in which:

Said conduits are arranged in a plunger, whereby each conduit has an entrance aperture on an underside of the plunger, and said gap is provided as a slot in a topside of the plunger;

A bath of cryogenic fluid is provided beneath said plunger;

Said sample is inserted into said slot using a tool that applies downward pressure on said plunger, thereby at least partially submerging the plunger and causing cryogenic fluid in said bath to flow into said entrance apertures and emerge through said mouthpieces.

Such a set-up effectively makes use of a fluid displacement mechanism similar to that used in a piston (whereby the plunger plays the role of the piston head [with overflow conduits], and the cryogenic bath is contained in the piston tube). It is similar to a set-up described in the aforementioned U.S. 2017/0169991 A1, but is modified according to the present invention so as to be able to produce a different flush of cryogenic fluid from each of the mouthpieces. One way to achieve this is use a shutter to close off a first of said conduits—connected to said first mouthpiece—after a given time interval. A convenient way to perform such delayed shuttering is using a construction wherein, as the plunger is submerged into said bath, a first of said apertures, connected to said first conduit, engages with a lid (cover; blanking member) disposed at a selected distance d below a surface of said bath, which lid then co-moves with the plunger so as to keep said first aperture closed. Such a scenario is depicted in FIGS. 3A-3C, for example. If the plunger is submerged with a vertical velocity v, then d can be selected so as to engage the shutter at a given time t=d/v (e.g. in a range 10-100 milliseconds (ms), such as 40-60 milliseconds, for instance) after flushing/depression of the plunger commences. The shutter itself may, for example, be:
- Embodied to be intrinsically buoyant in the employed cryogen bath, and/or be caused to be artificially "buoyant", e.g. by biasing it upward using a spring mechanism, for instance. In this way, the shutter will revert/relax back upward (to a default/initial position) when the plunger disengages therefrom (on its upward/return "stroke").
- Be attached to a guide/rail that constrains its motion to a vertical path.
- Be curtailed from rising above a certain level (at depth d) using an adjustable stop.

In an embodiment as described in the previous paragraph, it should be noted that:
- The "tool" in question may, for example, be a tweezers or pliers, which can be used to grasp the specimen by its edge. Such a tool may, for example, contain a feature such as a protrusion, burl or local enlargement that engages with the top of the plunger (or some structure thereon) in order to convert insertive motion of the tool (in the slot) into (downward) co-motion of the plunger.
- The plunger may initially (shallowly) float in the cryogen bath, or may alternatively hang over the bath.
- Although the illustrations in FIGS. 3A-3C depict a scenario in which the sample plane is oriented vertically and the cryogenic fluid flushes from the mouthpieces horizontally, this does not necessarily have to be the case. Instead, one could, for example, construct a set-up in which the sample plane is oriented horizontally, the mouthpieces are arranged above and below it, and the cryogenic fluid flushes from the mouthpieces vertically. In both scenarios, it is desirable to have the (cumulative) lengths of both conduits substantially equal, so as to ensure substantially synchronous issuance of cryogenic fluid from both mouthpieces when the plunger is suitably submerged.
- The plunger may be made of various materials, as long as they are compatible (e.g. in terms of brittleness) with use at cryogenic temperatures. Examples include stainless steel, titanium and (certain) ceramics, for instance.

For substantially planar samples with oppositely-located major surfaces—such as a grid/membrane as referred to above, or a flake/piece of a wafer, for example—the following considerations provide (non-binding) guidance when applying the present invention:
- One can associate a terminal/extremal/circumferential perimeter with each of the mouthpieces. This will typically be circular, although this does not necessarily have to be the case.
- These perimeters will ideally be centered on a common axis.
- This common axis will intersect the plane of the (planar) sample at an (approximately) normal/perpendicular angle. The common axis will also ideally pass through a geometric center/centroid/barycenter of the sample.
- Nominally, the sample will be positioned so that it is equidistant from the mouthpieces (or—in the case of sample comprising a membrane spanned on a grid—so that the membrane is equidistant from the mouthpieces). If the sample/membrane is closer to a particular mouthpiece, then one can still ensure simultaneous commencement of flushing of the frontside and backside of the sample by, for example:
- Slightly delaying pumping of cryogen into the conduit connected to that particular mouthpiece; or/and
- Embodying the conduit connected to that particular mouthpiece to be slightly longer than that connected to the other mouthpiece.

With respect to the cryogen bath into which the sample is plunged, there are various possible choices as regards the cryogen used. For example, various practitioners report using a liquid ethane/propane mix. In a particular embodiment of the invention, the cryogen in the bath comprises liquid ethane (without substantial quantities of other constituents) at a temperature in the range $-160°$ C. to $-183°$ C. When vitrifying a sample by plunge-cooling it, one can tend to adhere to a rule of "the colder the better". However, at temperatures below ca. $-183°$ C., the inventor has observed that liquid ethane can tend to become so viscous as to possibly impede the plunging process, e.g. by clinging to the sample holder. Temperatures above this level (e.g. $-175°$ C.) are therefore generally preferable.

In order to achieve satisfactory vitrification of the sample, its exposure to cryogenic fluid from the mouthpieces of the current invention should be relatively sudden—hence the term "flush". If exposure to the cryogenic fluid from the mouthpieces is more gradual/extended, then there is a risk that the sample will (at least partially) freeze into crystalline form rather than solidifying amorphously—which is undesirable in the context of the current invention. The timing and duration of the inventive flush can be tuned/optimized in dependence on various factors, such as the thickness of (the grid/membrane of) the sample, the temperature of the employed cryogenic fluid, the pressure/flow pattern produced by the mouthpieces, etc. As a non-binding example, the uninterrupted flush from the second mouthpiece may have a nominal duration in a range of 5-200 milliseconds, for instance; in the case of a sample comprising a holey membrane on a grid, a somewhat longer duration will generally help to ensure that, in addition to producing vitrification of the aqueous film in the holey membrane, residual heat is removed to a satisfactory extent from the grid (and any associated supporting member), so as to prevent unwanted "reheating" of the membrane by heat leakage from the grid. After vitrification occurs, the aqueous film temperature will preferably remain below about $-145°$ C., to prevent unwanted formation of crystalline ice. The skilled artisan will be able to choose the flush duration, tailored to the set-up and parameters pertaining to a given embodiment of the invention.

Although the invention has been set forth above with reference to grid-mounted samples, it should not be interpreted as being limited to such samples. In principle, the invention can be of use with any sample in which there is asymmetry/distinction between a first side and an oppositely disposed second side. For example:

One side may comprise a thick substrate, and the other side may comprise a thin lamination/film;

One side may comprise amorphous material and the other side may be crystalline;

One side may comprise a material with a first specific heat capacity, and the other side may comprise material with a substantially different heat capacity, etc. Such differences can justify application of the invention, whereby a first-side flush is configured to be different to a second-side flush.

The invention will now be elucidated in more detail on the basis of exemplary embodiments and the accompanying schematic drawings, in which.

Figure 3A:
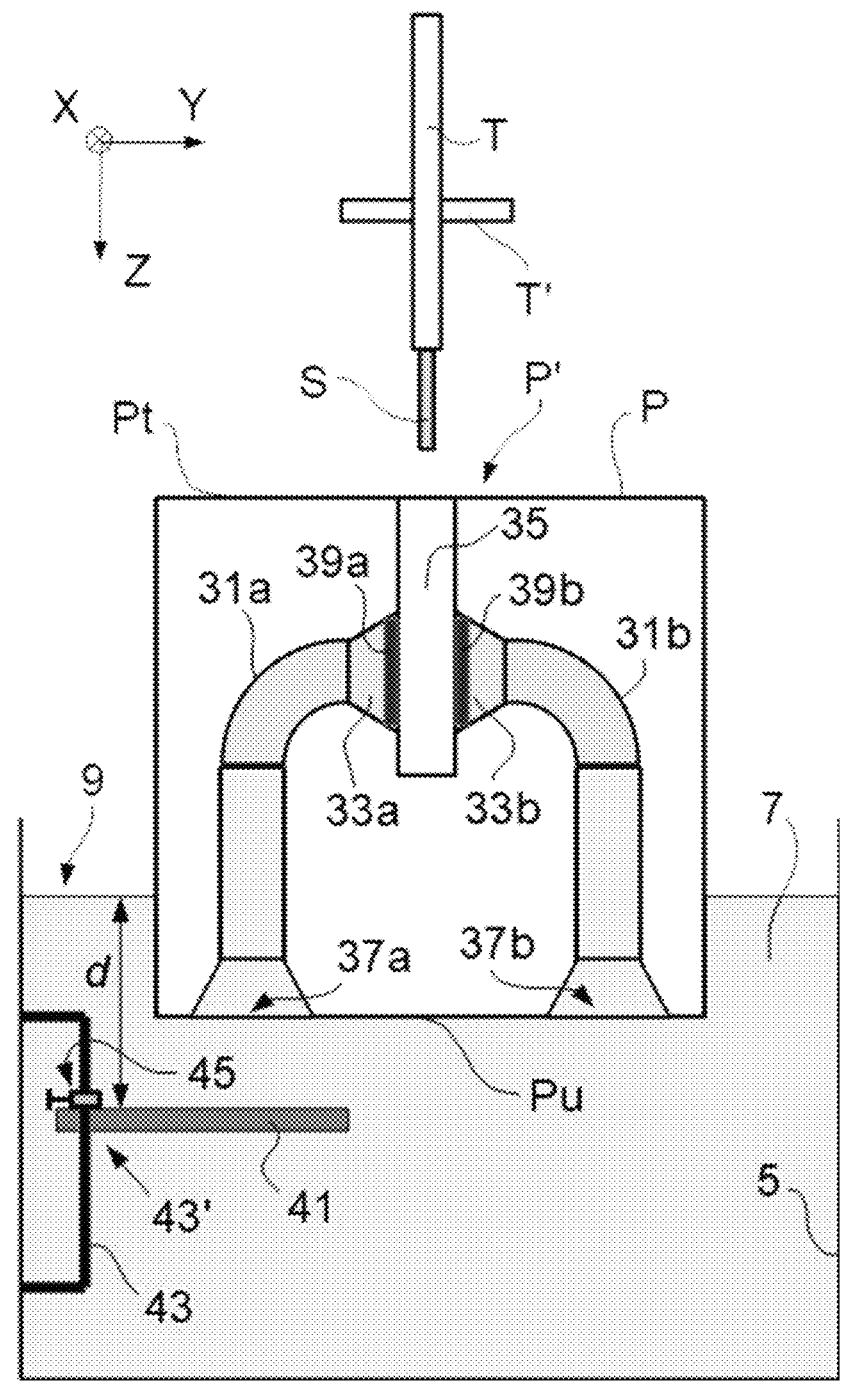
Figure 3B:
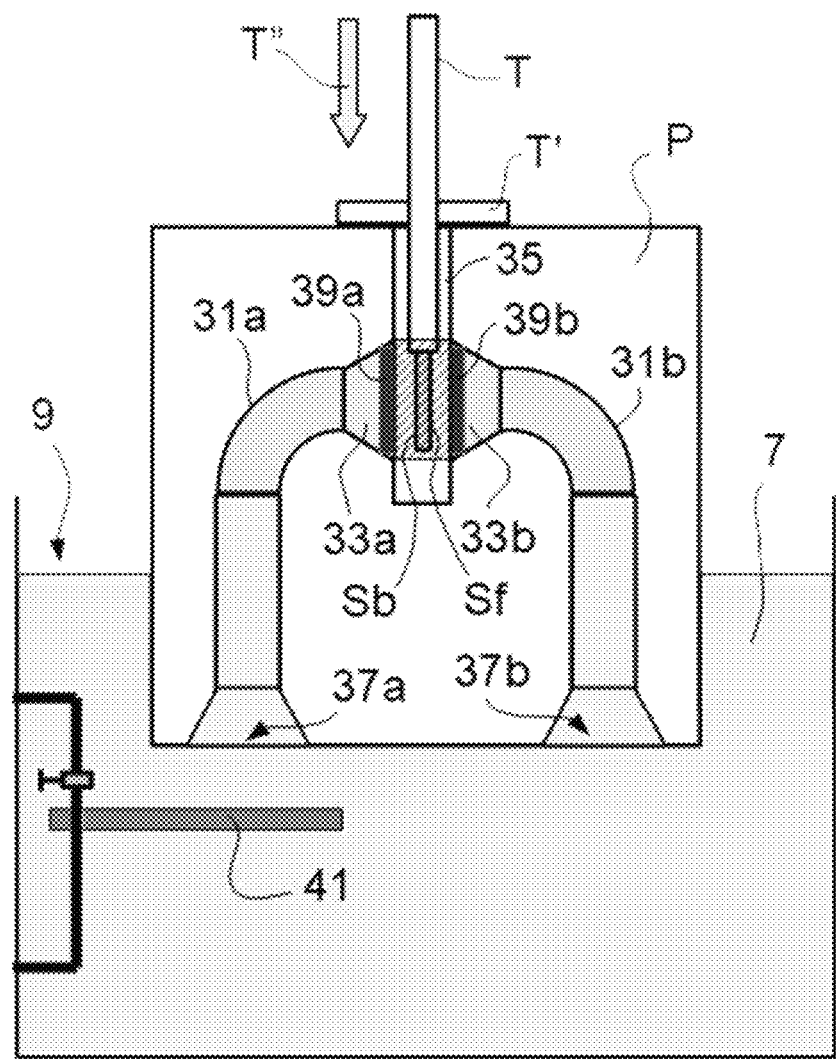
Figure 3C:
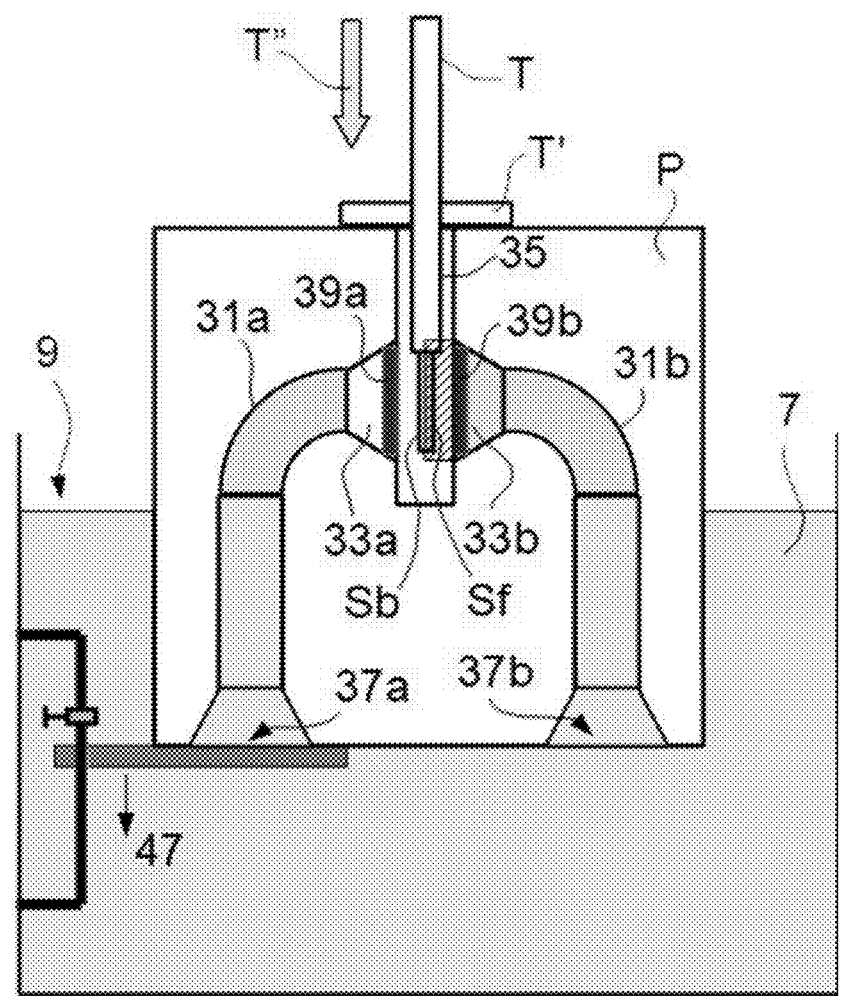

FIGS. 3A-3C render a longitudinal cross-sectional view of aspects of an embodiment of an apparatus according to the present invention (for enacting the inventive method).

Figure 4:
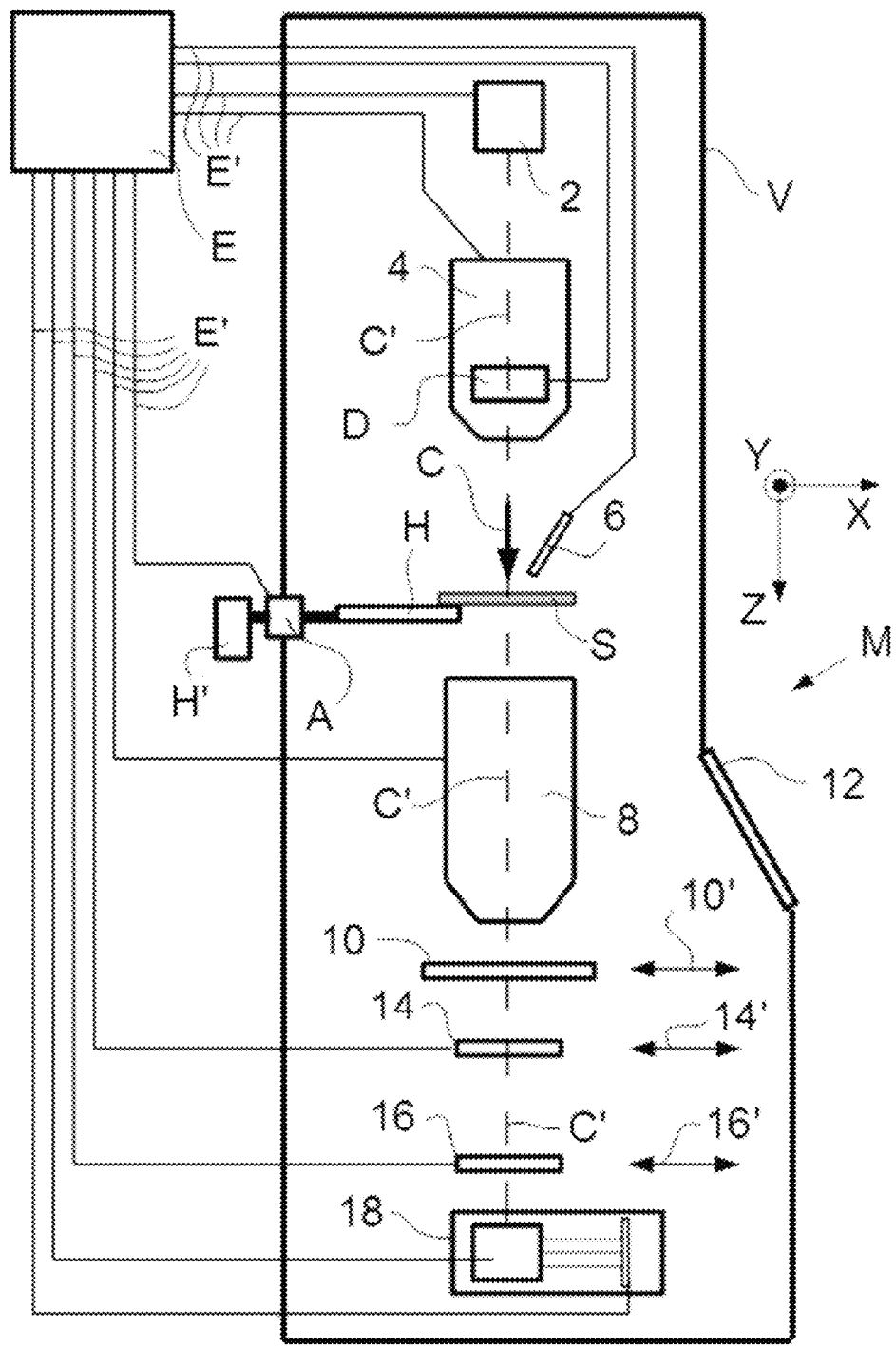

FIG. 4 renders a longitudinal cross-sectional view of a charged particle microscope that lends itself to use with the current invention.

In the Figures, where pertinent, corresponding parts may be indicated using corresponding reference symbols. It should be noted that, in general, the Figures are not to scale.

BACKGROUND EXAMPLE

Figure 1:
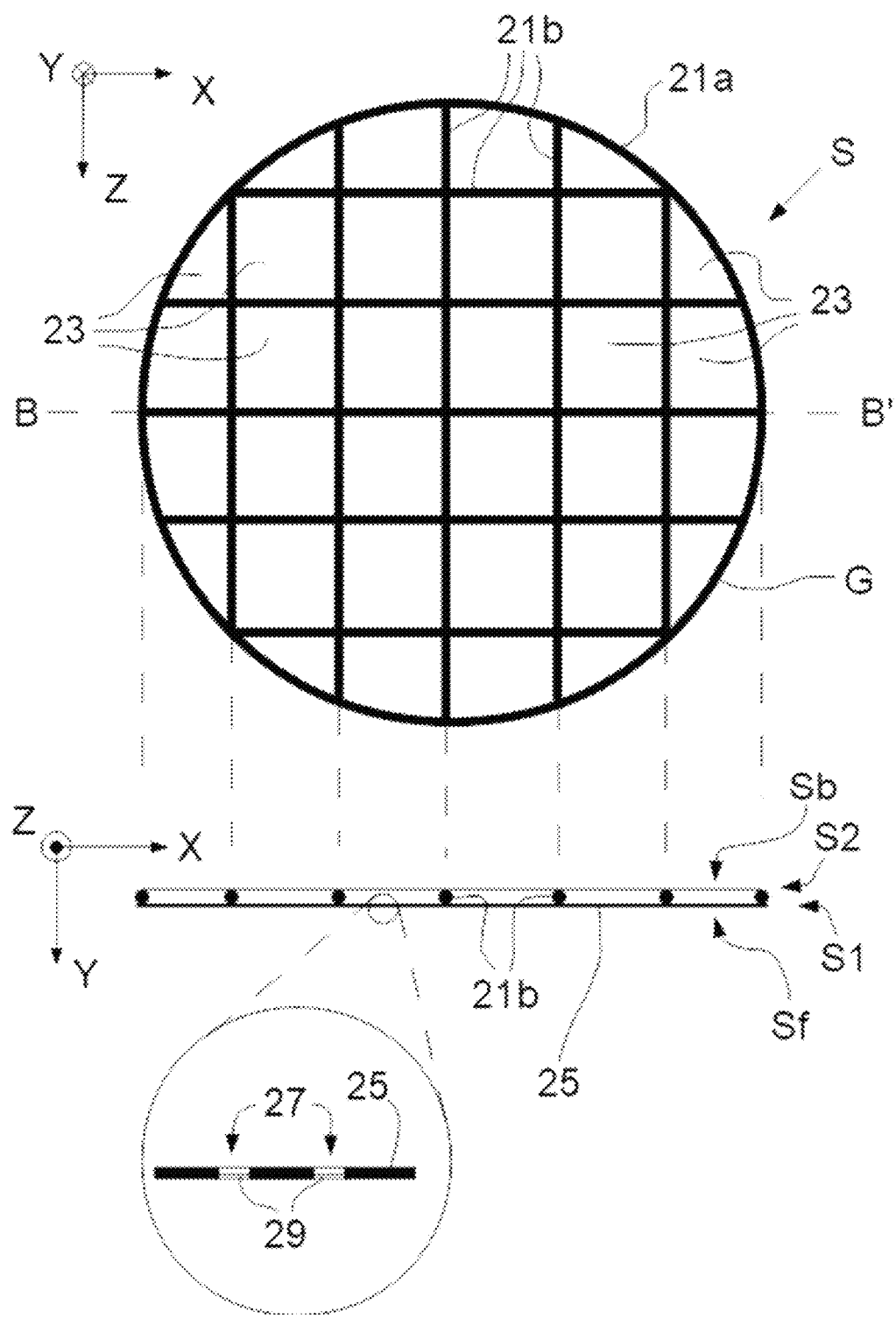
FIG. 1 illustrates (a particular embodiment of) a common sample structure used in vitrification procedures.

FIG. 1 renders detailed (magnified) views of aspects of a particular embodiment of a sample S that can be used in conjunction with the present invention. This particular type of sample S comprises what is often referred to as a "grid" or "Autogrid" G. It comprises a circular ring 21a of wire (e.g. comprising Cu or Ni, for instance), the diameter of the ring typically being of the order of about 3 mm and the diameter of the wire typically being of the order of about 20-100 µm. Attached within the ring 21a are straight wire portions 21b, which are (in this case) arranged to form an orthogonal grid pattern, thus defining a matrix-like array of (substantially square) apertures (openings/holes/windows) 23. The middle portion of FIG. 1 shows a transverse cross-sectional view of the upper portion of the Figure, taken along the diameter B-B'. It shows that the grid G has a substantially planar (plate-like) form, with opposed first (S1) and second (S2) "faces" substantially parallel to one another. As here depicted, a membrane 25 has been spanned upon the first face S1 (and, optionally, affixed to the wires 21b, e.g. using an adhesive or by molten bonding). This membrane 25 may, for example, comprise a carbonaceous material such as nylon or graphene, and will typically have a thickness (in the Y direction) ranging from about 0.3 nm to hundreds of nm. The membrane 25 contains a distribution of perforations 27, which are clearly visible in the detailed view at the bottom of the Figure. These perforations 27 typically have a diameter (parallel to the XZ plane) in a range of ca. 1.2-3.5 µm (e.g. ~2 µm). In essence, the grid G acts as a scaffold for the membrane 25, and the membrane 25 in turn acts as a supporting structure for the perforations 27 (so that it is sometimes referred to as a "holey carbon support"). It is within the perforations 27 that the ultimate "specimen" is to be provided and supported—in the form of a thin film 29 of aqueous liquid (comprising one or more study specimens suspended therein) that is spanned across each given perforation 27, remaining in place (inter alia) by virtue of surface tension effects. It should be noted that structures as depicted in FIG. 1 (grid G+perforated membrane 25, 27) and as described above are commercially available, e.g. from firms such as Ted Pella, Inc., of Redding, Calif., USA. It is also possible to purchase (a variety of) pre-manufactured holey carbon films (corresponding to the perforated membrane 25, 27), e.g. from firms such as Quantifoil Micro Tools GmbH, Jena, Germany. Inter alia in the context of the present invention, the illustrated structure can be regarded as having a "backside" Sb and a "frontside" Sf.

A film 29 of aqueous liquid can be provided in the various perforations 27 of the membrane 25 using methods well described in technical literature and known to the skilled artisan. In one such known method, a sheet of blotting paper (not depicted) is pressed against the outer/lower surface of membrane 25, is then moistened with the aqueous liquid in question, and is subsequently removed (e.g. peeled off) of the membrane 25—causing (most of) the apertures 27 to be endowed with a (mini-)film 29 of the aqueous liquid, which is spanned within them by surface tension effects. A method of this type is described, for example, in the article *Cryonegative Staining* by Marc Adrian et al. in Micron 29 (2-3), Elsevier Science Limited, 1998, pp. 145-160, and will not receive further attention here. Reference is also made to an alternative method that is set forth in U.S. Pat. No. 9,772,265 (with the same inventor/assignee as the present application, and incorporated herein by reference).

Figure 2:
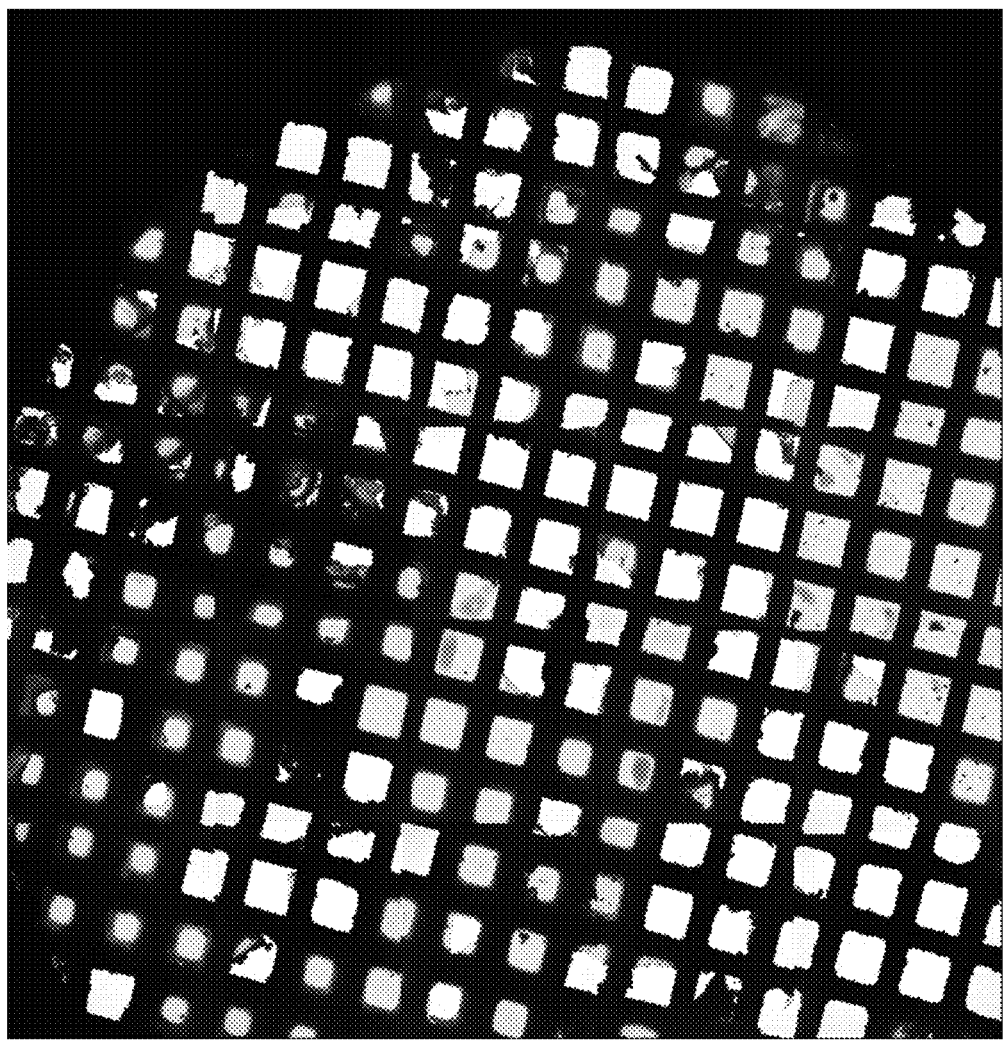
FIG. 2 shows sample damage that can result from application of a prior-art vitrification procedure.

Turning now to FIG. 2, this shows a particular sample of a type such as that illustrated in FIG. 1, after vitrification using the method set forth in the aforementioned U.S. 2017/0169991 A1 (same flush applied to backside and frontside of sample). The dark/mottled squares/cells are undamaged or only somewhat damaged (successful vitrification procedure), whereas the white squares/cells correspond to locations where membrane breakage/de-lamination has occurred (to a greater or lesser extent). In the current situation, it is seen that of the order of ca. 50% of the squares/cells are sub-optimal. As set forth above, closer examination of the sample (not evident in the current Figure) reveals that the damaged squares/cells have been detached with a prevalent backside-to-frontside directionality.

EMBODIMENT 1

FIGS. 3A-3C show aspects of an embodiment of a method and apparatus according to the present invention. Starting with FIG. 3A, this shows a pair of conduits 31a, 31b for transporting cryogenic fluid. Each of these conduits 31a, 31b has two extremal orifices, these being (respectively):

(Lower) entrance orifices 37a, 37b, through which cryogenic fluid can enter the conduits 31a, 31b;

(Upper) mouthpieces (exit orifices) 33a, 33b, through which cryogenic fluid can emerge from the conduits 31a, 31b. These mouthpieces 33a, 33b face each other across an intervening gap 35.

It should be noted that:

For convenience, the various components 31a, 31b, 33a, 33b, 35, 37a, 37b are here depicted as residing in a body P, which may serve as a matrix/structure to keep them in place; for example, body P might be a plug/block of metal, ceramic or epoxy in which these various components have been created by casting, molding, machining or 3D-printing, for instance. However, this does not necessarily have to be the case, and the various components could instead be (quasi-) free-standing structures.

The orifices 37a, 37b; 33a, 33b are here depicted as being flared, but that does not necessarily have to be the case.

The gap 35 is depicted as being of uniform width, but it could alternatively be tapered, for example. It should ideally be relatively narrow (in the Y direction), so as improve initial flush synchronization and symmetry.

As here depicted, a mesh/sieve/frothing member 39a, 39b is provided in respective mouthpieces 33a, 33b, disposed in close proximity to the (nominal) inserted position of sample S; this creates a "wall" close to sample S, so as to lower possible flushing latency and reduce any initial asymmetry/dissimilarity in the flush on both sides of the sample S, but still far enough from sample S to prevent "bridging" of cryogen.

Also depicted in FIG. 3A is a tool T (such as a tweezers, pincers, pliers, clamp, robot arm, etc.) that can be used to grasp and manipulate a sample S, e.g. by gripping it along its edge. This tool T can be used to position sample S in the gap 35 and between the mouthpieces 33a, 33b.

As already set forth above, one way to supply cryogenic fluid to the entrance orifices 37a, 37b is to simply connect them to (an electrical) cryogen pump (and associated cryogen reservoir) using suitable tubing/piping; one can then pump cryogen through the conduits 31a, 31b and out of the mouthpieces 33a, 33b so as to flush/shower (a sample S located in) the gap 35 with cryogenic fluid. However, in the current embodiment, use is instead made of a (manual) piston action to move cryogenic fluid through the conduits 31a, 31b. To this end, the body P is embodied as a plunger, which has an underside Pu (in which the entrance orifices 37a, 37b are located) and a topside Pt (through which it is possible to access gap 35). This plunger P can then, for example, be (partially) plunged/dipped into a container (tube, vessel) 5 of cryogen 7; as the plunger's underside Pu moves beneath the surface 9, cryogen 7 will be (progressively) forced through the entrance orifices 37a, 37b, though the conduits 31a, 31b and out of the mouthpieces 33a, 33b (see the progression from FIG. 3A to 3B to 3C, which illustrate part of this motion). Note in FIG. 3A that, prior to insertion of tool T/initiation of the plunging procedure, the conduits 31a, 31b have been primed/pre-filled with cryogen 7, e.g. as a result of pre-syphoning and/or capillary action from a previous plunging iteration. In this way, one ensures that a supply of cryogen is waiting in close proximity to the inserted position of the sample S, ready to gush out almost instantaneously, and thus lowering the risk of an unsynchronized flush from both sides of the sample S. In this regard, it should be noted that the meshes 39a, 39b help keep this "head" of primed cryogen in place within the conduits 31a, 31b.

To produce the desired plunging motion, the depicted set-up uses the tool T to apply downward force to the plunger P—although this does not necessarily have to be the case, and one could instead push the plunger P downward by other means. As shown in FIGS. 3B and 3C, the tool T has a protrusion/lug T' that engages with a reciprocal area/part P' of the topside Pt of plunger P, allowing downward force on tool T to transfer downward momentum to plunger P: see the illustrative downward arrow T" in FIGS. 3B, 3C. Moreover, the protrusion T' can (if so desired) be exploited to ensure that the sample S is inserted to an optimal depth in gap 35 (ideally substantially symmetrically between mouthpieces 33a, 33b) and can also be used to provide correct lateral positioning of the sample S in the gap 35 (once again, ideally with the (vitreous film of the) sample equidistant from mouthpieces 33a, 33b).

In a non-limiting example of a set-up such as that depicted here, the following illustrative (and approximate) values may apply:

Sample S comprises a planar grid of diameter 3 mm and thickness 0.4 mm.
Diameter of mouthpieces 33a, 33b: 3-4 mm.
Diameter of conduits 31a, 31b: 2.5 mm.
Separation of mouthpieces 31a, 31b/width of gap 35: 1 mm.
Flow rate from mouthpieces 31a, 31b: ~5-15 m/s.

The skilled artisan will be able to tailor his own values to the requirements of a given situation.

In the specific context of the present invention, the depicted apparatus has been configured such that the flush of cryogenic fluid applied from (left) mouthpiece 33a is different to that applied from (right) mouthpiece 33b—more specifically, to cause the flush from mouthpiece 33a to be of shorter duration than that from mouthpiece 33b. To this end, use is made of a shuttering mechanism (41, 43, 45) to close off (left) conduit 31a (which is connected to said (left) mouthpiece 33a) after elapse of a given time interval. More specifically, this shuttering mechanism comprises:

A lid (cover/blanker) 41, disposed at a selected nominal distance d below the surface 9 of the cryogen bath.
A rail/guide 43, which permits and guides motion of the lid 41 substantially parallel to the Z axis. To this end, the lid 43 may comprise an aperture 43' (or other suitable structure, such as a clasp or runner, for example) that co-operates with rail 43 so as to allow relative motion of the two.
A adjustable stop (such as a screw-locked sliding collar, for instance) that prevents upward motion of lid 41 beyond a certain point (at depth d).

As set forth above, the lid 41 may be naturally buoyant in cryogen 7 (e.g. because it is hollow) and/or may be biased upward using a spring, piston or magnetic arrangement, for example. In this way, lid 41 can co-move downward when it is engaged by plunger P, but will return/relax back upward when plunger P is disengaged therefrom. With particular reference to the individual Figures:

In FIG. 3B, such engagement has not yet occurred. The plunger P is moving downward through cryogen 7, forcefully introducing (more) cryogen into the conduits 31a, 31b. The associated pressure head causes cryogen to flush from both mouthpieces 31a, 31b, as illustrated in FIG. 3A by the hatched area filling the space between the mouthpieces 31a, 31b.
In FIG. 3C, the plunger P has engaged with lid 41, and the plunger P and lid 41 are co-moving downward (see arrow 47). Because of its size/positioning, the lid 41 only engages with left entrance orifice 37a, blocking/capping it and preventing flow of cryogen into it; on the other hand, right entrance orifice 37b is not impeded in this way. Consequently, the flush of cryogen from left mouthpiece 33a ceases, whereas the flush from right mouthpiece 33b continues. Note that the hatched area (flush) is now only coming from right mouthpiece 33b.

As set forth above, the skilled artisan can choose d and/or the downward velocity of plunger P so as to cause this termination of the flush from left mouthpiece 33a at a pre-selected time interval after commencement of flushing. This time interval may, for example, be of the order of 10-200 milliseconds.

EMBODIMENT 2

FIG. 4 is a highly schematic depiction of an embodiment of a CPM which can be used to examine a sample prepared in accordance with the present invention; more specifically, it shows an embodiment of a transmission-type microscope M, which, in this case, is a TEM/STEM (though, in the context of the current invention, it could just as validly be an ion-based microscope, for example). In the Figure, within a vacuum enclosure V, an electron source 2 (such as a Schottky emitter, for example) produces a beam C of electrons that traverse an electron-optical illuminator 4, serving to direct/focus them onto a chosen part of a specimen S (which may, for example, be (locally) thinned/planarized). This illuminator 4 has an electron-optical axis C', and will generally comprise a variety of electrostatic/magnetic lenses, (scan) deflector(s) D, correctors (such as stigmators), etc.; typically, it can also comprise a condenser system (the whole of item 4 is sometimes referred to as "a condenser system").

The specimen S is held on a specimen holder H that can be positioned in multiple degrees of freedom by a positioning system/stage A; for example, the specimen holder H may comprise a finger that can be moved (inter alia) in the XY plane (see the depicted Cartesian coordinate system; typically, motion parallel to Z and (at least) tilt about X/Y will also be possible). Such movement allows different parts of the specimen S to be irradiated/imaged/inspected by the electron beam traveling along axis C' (in the Z direction) (and/or allows scanning motion to be performed, as an alternative to beam scanning). A cooling device H' is in intimate thermal contact with the specimen holder H, and is capable of maintaining the latter at cryogenic temperatures, e.g. using a vat of cryogenic coolant to achieve and maintain a desired low temperature.

The (focused) electron beam C traveling along axis C' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 6, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, emerge (emanate) from it and continue to propagate (substantially, though generally with some deflection/scattering) along axis C'. Such a transmitted electron flux enters an imaging system (combined objective/projection lens) 8, which will generally comprise a variety of electrostatic/magnetic lenses, deflectors, correctors (such as stigmators), etc. In normal (non-scanning) TEM mode, this imaging system 8 can focus the transmitted electron flux onto a fluorescent screen 10, which, if desired, can be retracted/withdrawn (as schematically indicated by arrows 10') so as to get it out of the way of axis C'. An image (or diffractogram) of (part of) the specimen S will be formed by imaging system 8 on screen 10, and this may be viewed through viewing port 12 located in a suitable part of a wall of enclosure V. The retraction mechanism for screen 10 may, for example, be mechanical and/or electrical in nature, and is not depicted here.

As an alternative to viewing an image on screen 10, one can instead make use of the fact that the depth of focus of the electron flux emerging from imaging system 8 is generally quite large (e.g. of the order of 1 meter). Consequently, various other types of analysis apparatus can be used downstream of screen 10, such as:

- TEM camera 14. At camera 14, the electron flux can form a static image (or diffractogram) that can be processed by controller E and displayed on a display device (not depicted), such as a flat panel display, for example. When not required, camera 14 can be retracted/withdrawn (as schematically indicated by arrows 14') so as to get it out of the way of axis C'.
- STEM imager (camera) 16. An output from imager 16 can be recorded as a function of (X,Y) scanning position of the beam C on the specimen S, and an image can be constructed that is a "map" of output from imager 16 as a function of X,Y. Imager 16 can, for example, comprise a single pixel with a diameter of e.g. 20 mm, as opposed to the matrix of pixels characteristically present in camera 14. Moreover, imager 16 will generally have a much higher acquisition rate (e.g. $10^6$ points per second) than camera 14 (e.g. $10^2$ images per second). Once again, when not required, imager 16 can be retracted/withdrawn (as schematically indicated by arrows 16') so as to get it out of the way of axis C' (although such retraction would not be a necessity in the case of a donut-shaped annular dark field imager 16, for example; in such an imager, a central hole would allow beam passage when the imager was not in use).
- As an alternative to imaging using camera 14 or imager 16, one can also invoke spectroscopic apparatus 18, which could be an EELS module, for example (EELS=Electron Energy-Loss Spectroscopy).

It should be noted that the order/location of items 14, 16 and 18 is not strict, and many possible variations are conceivable. For example, spectroscopic apparatus 18 can also be integrated into the imaging system 8.

Note that the controller (computer processor) E is connected to various illustrated components via control lines (buses) E'. This controller E can provide a variety of functions, such as synchronizing actions, providing setpoints, processing signals, performing calculations, and displaying messages/information on a display device (not depicted). Needless to say, the (schematically depicted) controller E may be (partially) inside or outside the enclosure V, and may have a unitary or composite structure, as desired. The skilled artisan will understand that the interior of the enclosure V does not have to be kept at a strict vacuum; for example, in a so-called "Environmental TEM/STEM", a background atmosphere of a given gas is deliberately introduced/maintained within the enclosure V. The skilled artisan will also understand that, in practice, it may be advantageous to confine the volume of enclosure V so that, where possible, it closely embraces the axis C', taking the form of a small tube (e.g. of the order of 1 cm in diameter) through which the employed electron beam passes, but widening out to accommodate structures such as the source 2, specimen holder H, screen 10, camera 14, imager 16, spectroscopic apparatus 18, etc.

The specimen S shown in FIG. 4 can, for example, be a specimen that has undergone a vitrification procedure according to the present invention. Such a specimen can be maintained at cryogenic temperatures while it is in the CPM M (and also while it is being transported/stored) thanks to the cooling device H'. To this end, one can, for example, employ an embodiment such as the following:

The cooling device H' comprises a dewar/flask that is intimately thermally connected (e.g. via a copper rod and/or braid) to holder H, and that can be filled with a cryogen.

The composite structure H+H' can be inserted into/removed from the CPM M, whereby it can be seated into/clamped by a receiver portion of positioning system A.

Refer, for example, to the set-up discussed in United States Patent Application U.S. 2012/0112064 A1, and similar such set-ups.

The invention claimed is:

1. A method of preparing a cryogenic sample, whereby the sample is subjected to rapid cooling using a cryogen, comprising:
   providing two conduits for transporting cryogenic fluid, each of which conduits opens out into a mouthpiece, which mouthpieces are arranged to face each other across an intervening gap;
   placing the sample in said gap; and
   pumping cryogenic fluid through said conduits so as to concurrently flush from said mouthpieces, thereby suddenly immersing the sample in cryogenic fluid from two opposite sides,
   wherein by reducing the flush of cryogenic fluid applied from a first of said mouthpieces after a given time interval, such that the flush of cryogenic fluid from said first of said mouthpieces is different to that applied from the second of said mouthpieces.

2. A method according to claim 1, wherein the duration of the flush of cryogenic fluid applied from said first mouthpiece is shorter to that applied from said second mouthpiece.

3. A method according to claim 1, wherein the flushes from both mouthpieces commence substantially simultaneously.

4. A method according to claim 1, wherein the flush from said first mouthpiece is terminated after said given time interval.

5. A method according to claim 1, wherein a shutter is used to reduce the flush of cryogenic fluid applied from said first of said mouthpieces.

6. A method according to claim 1, wherein:
   said conduits are arranged in a plunger, whereby each conduit has an entrance aperture on an underside of the plunger, and said gap is provided as a slot in a topside of the plunger;
   a bath of cryogenic fluid is provided beneath said plunger; and
   said sample is inserted into said slot using a tool that applies downward pressure on said plunger, thereby at least partially submerging the plunger and causing cryogenic fluid in said bath to flow into said entrance apertures and emerge through said mouthpieces.

7. A method according to claim 6, wherein as the plunger is submerged into said bath, a first of said apertures, connected to said first conduit, engages with a lid disposed at a selected distance below a surface of said bath, which lid then co-moves with the plunger so as to keep said first aperture closed.

8. A method according to claim 1, wherein:
   said sample is substantially planar, with oppositely-located major surfaces; and
   the sample is arranged in said gap so that said major surfaces face said mouthpieces.

9. A method according to claim 8, wherein:
   said sample comprises a planar grid that carries a perforated membrane, whereby a backside of the membrane is laid upon a face of the grid; and
   said sample is positioned between said mouthpieces so that said backside faces said first mouthpiece.

10. A method according to claim 1, wherein said cryogenic fluid comprises liquid ethane at a temperature in the range $-160°$ C. to $-183°$ C.

11. An apparatus for preparing a cryogenic sample, whereby the sample is subjected to rapid cooling using a cryogen, the apparatus comprising:
    a pair of conduits for transporting cryogenic fluid, each of which conduits opens out into a mouthpiece, which mouthpieces are arranged to face each other across an intervening gap in which the sample can be arranged; and
    a pumping mechanism, for pumping cryogenic fluid through said conduits so as to concurrently flush from said mouthpieces and suddenly immerse the sample in cryogenic fluid from two opposite sides,
    wherein the flush of cryogenic fluid applied from a first of said mouthpieces can be reduced such that the flush of cryogenic fluid applied from a first of said mouthpieces after a given time interval is different to that applied from the second of said mouthpieces.

12. An apparatus according to claim 11, wherein:
    said conduits are arranged in a plunger, whereby each conduit has an entrance aperture on an underside of the plunger, and said gap is provided as a slot in a topside of the plunger;
    said cryogenic fluid can be provided in a bath beneath said plunger, and
    said slot is configured to engage with a tool that inserts a sample into said slot and concurrently applies downward pressure on said plunger, so as to at least partially submerge the plunger in said bath and cause cryogenic fluid to flow into said entrance apertures and emerge through said mouthpieces.

13. An apparatus according to claim 12, comprising a shutter that is arranged to close off a first of said conduits, connected to said first mouthpiece, when the plunger reaches a given depth in said bath.

* * * * *